United States Patent [19]
Yokomizo

[11] Patent Number: 5,175,752
[45] Date of Patent: Dec. 29, 1992

[54] FREQUENCY DIVIDER WITH REDUCED CLOCK SKEW

[75] Inventor: Koichi Yokomizo, Tokyo, Japan

[73] Assignee: Oki Electric Industry Co., Ltd., Tokyo, Japan

[21] Appl. No.: 772,939

[22] Filed: Oct. 8, 1991

[30] Foreign Application Priority Data

Oct. 16, 1990 [JP] Japan ............... 2-276855

[51] Int. Cl.$^5$ ........................... H03K 21/08
[52] U.S. Cl. ........................... 377/47; 377/28; 377/114; 307/247.1
[58] Field of Search ............ 377/47, 114, 28; 307/247.1

[56] References Cited

U.S. PATENT DOCUMENTS 3,902,125  8/1975  Oliva ...................... 377/47
4,281,259  7/1981  Ozawa ................... 307/247.1
4,348,640  9/1982  Clendening .............. 377/47
4,366,394 12/1982  Clendening et al. ...... 377/47

*Primary Examiner*—John S. Heyman
*Attorney, Agent, or Firm*—Spencer, Frank & Schneider

[57] ABSTRACT

A first frequency dividing circuit receives an input clock signal from an input terminal and divides the frequency of the input clock signal to produce a first signal which it supplies to an output terminal. A second frequency dividing circuit divides the frequency of the input clock signal to produce a second signal having the same frequency as the first signal but differing from the first signal in phase. The second signal controls a gating circuit. When switched on, the gating circuit connects the output terminal to the input terminal, or to an auxiliary power-supply or ground terminal, thereby deskewing the signal at the output terminal.

13 Claims, 4 Drawing Sheets

FREQUENCY DIVIDER WITH REDUCED CLOCK SKEW

BACKGROUND OF THE INVENTION

This invention relates to a frequency divider that receives an input clock signal and generates an output clock signal having a lower frequency. More particularly, it relates to an improved frequency divider with reduced clock skew.

Frequency dividers are extensively used in semiconductor integrated circuits, but existing frequency dividers tend to generate a large clock skew; that is, transitions in the output clock signal lag transitions in the input clock signal by a large amount. Clock skew can cause major timing difficulties, particularly when both the input and output clock signals are used for timing purposes.

SUMMARY OF THE INVENTION

It is accordingly an object of the present invention to deskew the output clock signal of a frequency divider.

Another object of the invention is to shorten the transition time of the output clock signal.

A frequency divider has an input terminal that receives an input clock signal. A first frequency dividing means divides the frequency of the input clock signal to produce a first signal. A second frequency dividing means divides the frequency of the input clock signal to produce a second signal having the same frequency as the first signal but differing from the first signal in phase. The first signal is supplied to an output terminal. The second signal is used for control of a gating means.

According to one aspect of the invention, the gating means is also controlled by a third signal which is generated from the first signal by a delay line. When turned on, the gating means supplies the input clock signal directly to the output terminal.

According to another aspect of the invention, the gating means is also controlled by the input clock signal. When turned on, the gating means connects the output terminal to an auxiliary terminal such as a ground terminal or power supply terminal.

DETAILED DESCRIPTION OF THE INVENTION

Novel frequency dividers will be described with reference to the drawings. For simplicity's sake all of them will divide the frequency of the input clock signal by two, but the invention is not limited to this case; the clock frequency can be divided by any integer N greater than one. Divide-by-N circuits are well known, and those skilled in the art will readily see how they can be incorporated into the present invention.

In the first novel frequency divider, transitions of the output clock signal occur on rising edges of the input clock signal, and the rising edge of the output clock signal is deskewed. That is, low-to-high transitions of the output clock signal are made substantially simultaneous with low-to-high transitions of the input clock signal. This property is useful when both the input and output clock signals are supplied as timing signals to other circuits and the rising edge of the output clock signal is used to trigger circuit operations.

Figure 1:
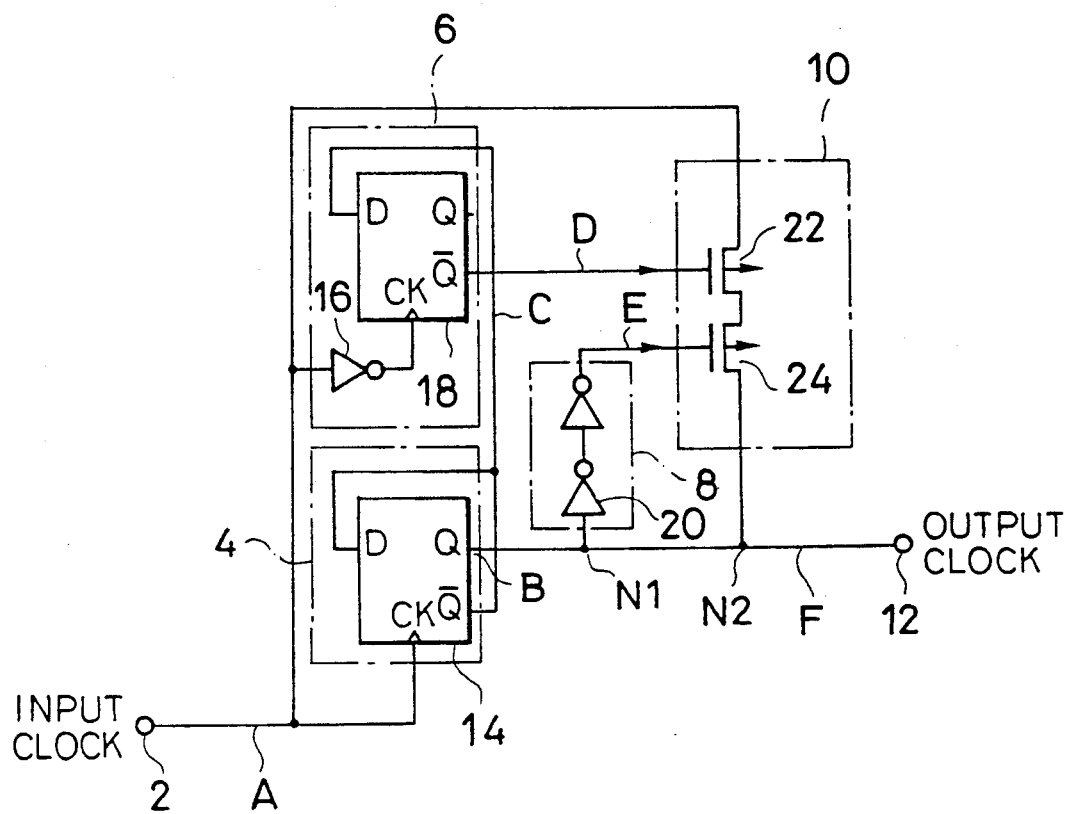
FIG. 1 is a schematic diagram of a first novel frequency divider.

With reference to FIG. 1, the first novel frequency divider has an input terminal 2 for receiving an input clock signal that alternates between a first potential and a second potential at a certain frequency. The first potential is a ground potential (0V) and the second potential is a higher potential such as +5 V. The frequency divider comprises a first frequency dividing circuit 4, a second frequency dividing circuit 6, a delay line 8, and a gating circuit 10. These circuits supply an output terminal 12 with an output clock signal having half the frequency of the input clock signal.

The first frequency dividing circuit 4 comprises a first flip-flop 14 of the edge-triggered D type, which latches the input at its D terminal on rising edges of the signal received at its CK terminal, outputs the latched input at a noninverting output terminal Q, and outputs the inverse of the latched input at an inverting output terminal $\overline{Q}$. The CK terminal receives the input clock signal from the input terminal 2. The D and $\overline{Q}$ terminals of the first flip-flop 14 are interconnected, causing the Q and $\overline{Q}$ outputs to toggle at each rising edge of the input clock signal. The $\overline{Q}$ output is also sent to the second frequency dividing circuit 6. The Q output is sent as a first signal via nodes N1 and N2 to the output terminal 12.

The second frequency dividing circuit 6 comprises an inverter 16 and a second flip-flop 18. The inverter 16 receives the input clock signal A from the input terminal 2 and outputs an inverted clock signal to the CK input of the second flip-flop 18. The second flip-flop 18 operates in the same way as the first flip-flop 14, but is triggered by falling edges of the input clock signal A because of the presence of the inverter 16. The D input of the second flip-flop 18 is connected to the inverting output $\overline{Q}$ of the first flip-flop 14, and the inverting output $\overline{Q}$ of the second flip-flop 18 is supplied as a second signal to the gating circuit 10. The noninverting output Q of the second flip-flop 18 is not connected.

The input side of the delay line 8 is connected to the first node N1 and thus receives the same output clock signal as the output terminal 12. The delay line 8 delays the output clock signal by a certain amount and outputs the delayed signal as a third signal to the gating circuit 10. The delay line 8 comprises, for example, an even number of inverters 20 connected in series. Two inverters 20 are shown in the drawing but of course a larger number may be employed if necessary.

The gating circuit 10 comprises a pair of PMOS field-effect transistors connected in series. The source of the first PMOS transistor 22 is connected to the input terminal 2 and receives the input clock signal. The gate of the first PMOS transistor 22 is connected to the inverting output $\overline{Q}$ of the second flip-flop 18 and receives the above-mentioned second signal. The drain of the first PMOS transistor 22 is connected to the source of the second PMOS transistor 24. The gate of the second PMOS transistor 24 is connected to the output of the delay line 8 and receives the above-mentioned third signal. The drain of the second PMOS transistor 24 is connected to the second node N2.

The operation of the first novel frequency divider will be described with reference to waveforms of the following signals in FIG. 1:

A input clock signal

B first signal output from first frequency dividing circuit 4 to output terminal 12; noninverting output Q of first flip-flop 14

C inverting output $\overline{Q}$ of first flip-flop 14

D second signal output from second frequency dividing circuit 6 to gating circuit 10

E third signal output from delay line 8 to gating circuit 10

F output clock signal

Figure 2:
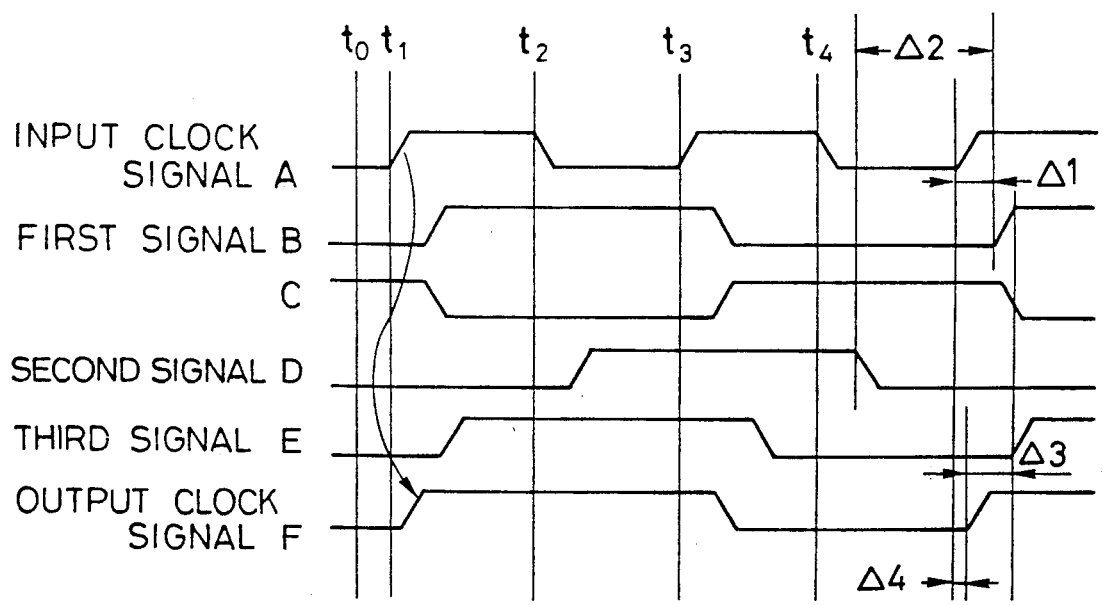
FIG. 2 is a timing diagram illustrating the operation of the first novel frequency divider.

Referring to FIG. 2, at a time $t_0$ the input clock signal A, the first signal B, and the output clock signal F are all low, the signal C is high, and the second and third signals D and E input to the gating circuit 10 are both low. The first and second PMOS transistors 22 and 24 are therefore both in the on-state.

At time $t_1$ the input clock signal A goes high. The high input clock signal A is conducted through the first and second PMOS transistors 22 and 24 to the second node N2, the first node N1, and the output terminal 12, so the output clock signal F goes high at substantially the same time. After a certain delay the third signal E from the delay line 8 also goes high, turning off the second PMOS transistor 24. Meanwhile, the rise of the input clock signal A has toggled the first flip-flop 14, so the first signal B is now high. The output clock signal F therefore remains high even after the second PMOS transistor 24 turns off. The signal C goes low when the first signal B goes high.

Figure 1A:
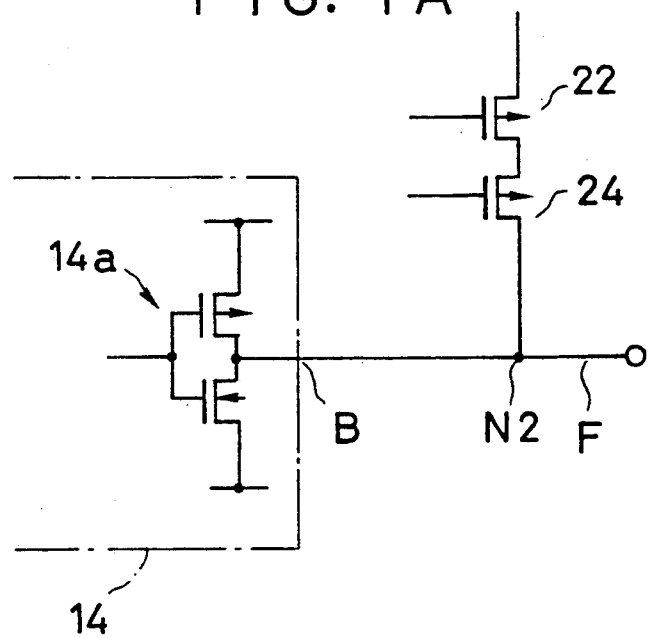
FIG. 1A is a circuit diagram showing the output stage of the inverter 14 and the transistors 22 and 24 in FIG. 1.

During the time interval in which the high input clock signal A is conducted through the first and second PMOS transistors 22 and 24, and the first signal B from the flip-flop 14 is still low, there is a contention between the driving power of the transistors 22 and 24 and the driving power of the flip-flop 14, in particular its output stage, which is typically formed of an inverter 14a, as shown in FIG. 1A. That is, the transistors 22 and 24 tend to raise the node N2 to the high level, while the inverter 14a forming the output stage of the flip-flop 14 tends to retain the node N2 at the low level. To insure that the node N2 be made high or substantially high, the driving power of the transistors 22 and 24 is made sufficiently larger than the driving power of the inverter 14a of the output stage of the flip-flop 14.

At time $t_2$ the input clock signal A goes low, causing the second flip-flop 18 to latch its input C which is now low. After a certain delay the second signal D goes high, turning off the first PMOS transistor 22.

At time $t_3$ the input clock signal A goes high, toggling the first flip-flop 14. After a certain delay the outputs B and C of the first flip-flop 14 change state, the first signal B going low. The high input clock signal A does not reach the nodes N1 and N2 or the output terminal 12 because the first and second PMOS transistors 22 and 24 are off, so when the first signal B goes low, the output clock signal signal F also goes low. After a certain delay, the third signal E output by the delay line 8 goes low, turning on the second PMOS transistor 24.

At time $t_4$ the input clock signal A goes low, causing the second flip-flop 18 to latch its input C which is now high. After a certain delay the second signal D accordingly goes low, turning on the first PMOS transistor 22. The circuit is now in the same state as at time $t_0$, with the first and second PMOS transistors 22 and 24 both on and the input clock signal A, the first signal B, and the output clock signal F all low. Thereafter, the same sequence of operations is repeated.

Timing relationships are shown at the right in FIG. 2. Transitions of the first signal B lag rising edges of the input clock signal A by an amount $\Delta 1$. In the prior art the first signal was used directly as the output clock signal, resulting in a clock skew of $\Delta 1$.

Regarding the phase difference between the second signal D and the first signal B, the transitions of interest are the high-to-low transitions of the second signal D and the low-to-high transitions of the first signal B. High-to-low transitions of the second signal D lead low-to-high transitions of the first signal B by an amount $\Delta 2$. In the drawing $\Delta 2$ is shown as substantially one-half the period of the input clock signal A. Actually, $\Delta 2$ is slightly less than this amount because of the delay caused by the inverter 16, but this does not affect the operation of the circuit. It suffices for $\Delta 2$ to be greater than $\Delta 1$.

The third signal E lags the output clock signal F by an amount $\Delta 3$. The gating circuit 10 is in the conducting state during the interval from a high-to-low transition of the second signal D to the following low-to-high transition of the third signal E. The delay $\Delta 3$ must be arranged so that this interval includes the low-to-high transition of the first signal B.

The novel frequency divider is not completely free of skew. Inevitably, there is a slight delay $\Delta 4$ from the rise of the input clock signal A to the rise of the output clock signal F. This slight skew $\Delta 4$ is much less than the skew $\Delta 1$ in the prior art, however, because it does not include the logic delays of the first flip-flop 14.

Next a second novel frequency divider will be described. The description will omit elements appearing in the first novel frequency divider, which will be identified by the same reference numerals.

Figure 3:
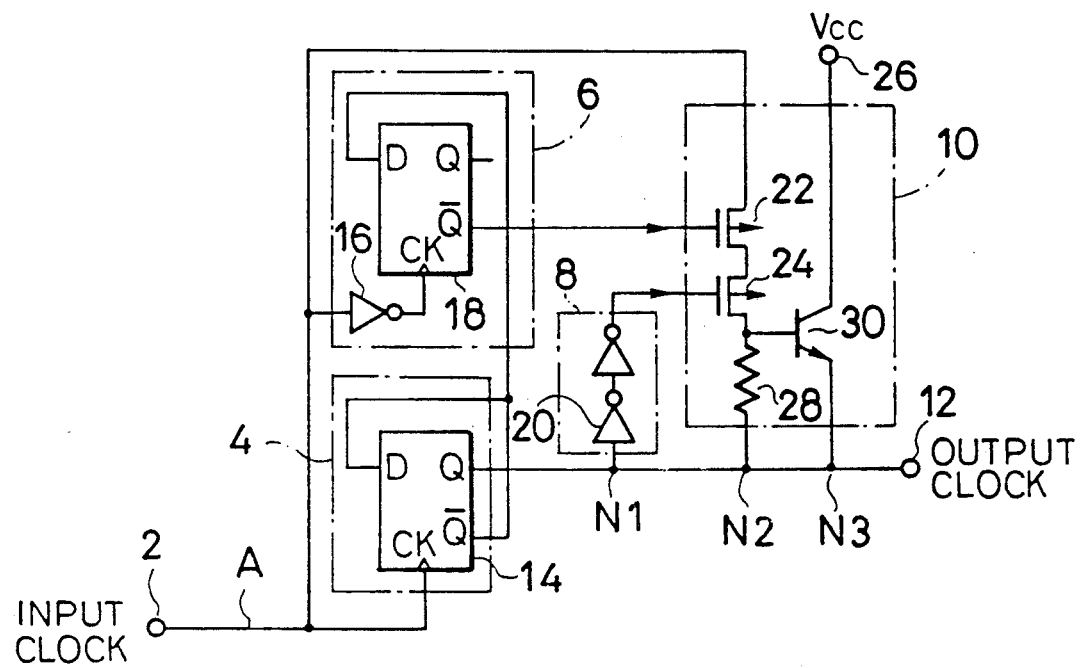
FIG. 3 is a schematic diagram of a second novel frequency divider.

Referring to FIG. 3, the second novel frequency divider is identical to the first novel frequency divider in FIG. 1 except for the addition of an auxiliary terminal 26 that supplies the second (high) potential, indicated as Vcc in the drawing, and the addition of a resistor 28 and a bipolar transistor 30 to the gating circuit 10. The resistor 28 is connected in series between the drain of the second PMOS transistor 24 and the second node N2. The bipolar transistor 30 is connected in series between the auxiliary terminal 26 and an output node N3 disposed between the second node N2 and the output terminal 12.

The base of the bipolar transistor 30 is connected to the drain of the second PMOS transistor 24; thus the bipolar transistor 30 is switched on by drain current from the second PMOS transistor 24. The function of the resistor 28 is to draw current from the base of the bipolar transistor 30 when the first PMOS transistor 22 or the second PMOS transistor 24 is in the off-state, so that the bipolar transistor 30 will turn off.

The second novel frequency divider operates in the same way as the first novel frequency divider except for the brief interval after $t_1$ in FIG. 2 during which the first and second PMOS transistors 22 and 24 are both on and the input clock signal is high. In this interval the bipolar transistor 30 turns on and conducts Vcc to the output terminal 12, causing the output clock signal to rise faster than in the first novel frequency divider. In addition, the large current driving capability of the bipolar transistor 30 is useful when a large capacitive load is connected to the output terminal 12.

A third novel frequency divider will now be described in which the falling edge of the output clock signal is deskewed, making high-to-low transitions of the output clock signal substantially simultaneous with low-to-high transitions of the input clock signal. This property is useful when both the input and output clock signals are supplied as timing signals to other circuits and the falling edge of the output clock signal is used to trigger circuit operations. Elements that have already appeared in the first novel frequency divider will be identified by the same reference numerals and will not be described in detail.

Figure 4:
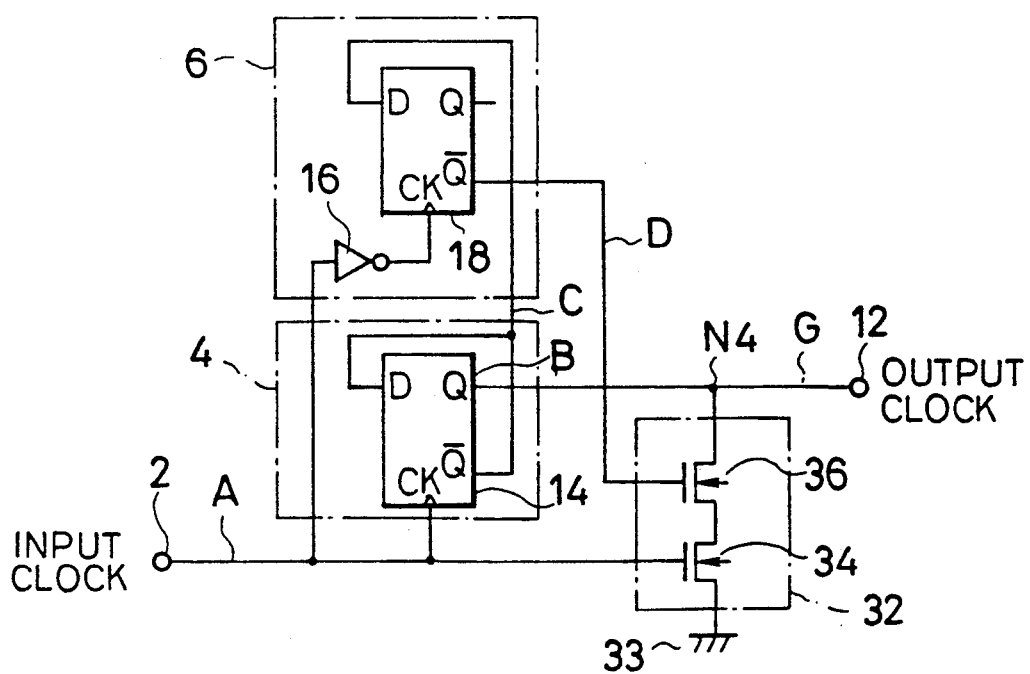
FIG. 4 is a schematic diagram of a third novel frequency divider.

Referring to FIG. 4, the third novel frequency divider has an input terminal 2, a first frequency dividing circuit 4, a second frequency dividing circuit 6, and an output terminal 12 identical to those in the first novel frequency divider. The first signal B from the noninverting output Q of the first flip-flop 14 is supplied via a node N4 to the output terminal 12. The node N4 is connected via a gating circuit 32 to an auxiliary terminal 33, which in this case is a ground terminal.

The gating circuit 32 comprises a pair of NMOS transistors 34 and 36. The source of the first NMOS transistor 34 is connected to the first auxiliary terminal 33, the gate of the first NMOS transistor 34 is connected to the input terminal 2, and the drain of the first NMOS transistor 34 is connected to the source of the second NMOS transistor 36. The gate of the second NMOS transistor 36 receives the second signal D from the inverting output Q of the second flip-flop 18. The drain of the second NMOS transistor 36 is connected to the node N4.

The operation of the third novel frequency divider will be described with reference to signal waveforms at the points A, B, C, D, and G in FIG. 4. A to D are as in the first novel frequency divider; G is the output clock signal.

Figure 5:
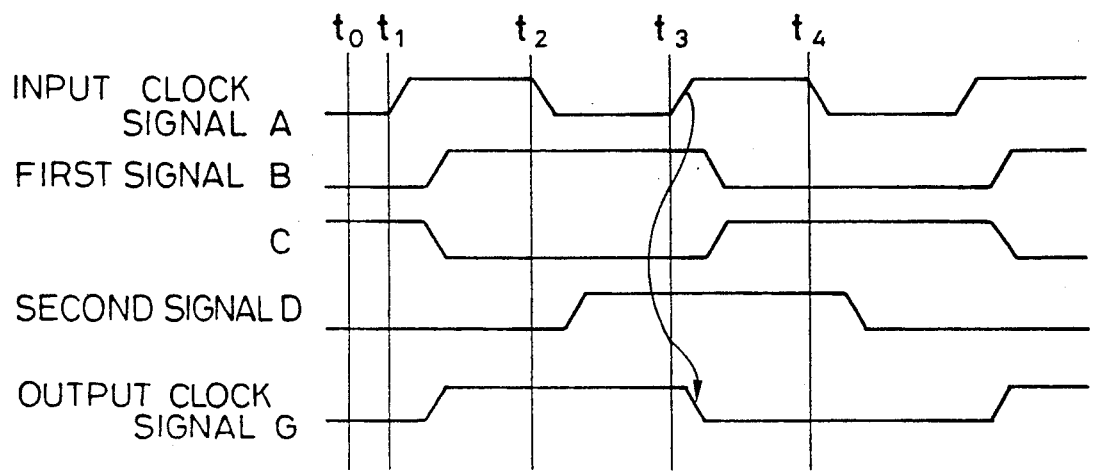
FIG. 5 is a timing diagram illustrating the operation of the third novel frequency divider.

Referring to FIG. 5, at time $t_0$ the input clock signal A, the first signal B, and the output clock signal G are all low, the signal C high, and the second signal D is low. The first and second NMOS transistors 34 and 36 are both off.

At time $t_1$ the input clock signal A goes high, turning on the first NMOS transistor 34 and toggling the first flip-flop 14. After a certain delay, the first signal B goes high and with it the output clock signal G. The signal C input to the second flip-flop 18 goes low. The second signal D remains low, so the second NMOS transistor 36 remains off, isolating the output terminal 12 from the first auxiliary terminal 33.

At time $t_2$ the input clock signal A goes low, turning off the first NMOS transistor 34 and causing the second flip-flop 18 to latch its low input C. After a certain delay the second signal D output from the second flip-flop 18 goes high. This turns on the second NMOS transistor 36, but the first NMOS transistor 34 is now off so the output terminal 12 is still isolated from the first auxiliary terminal 33.

At time $t_3$ the input clock signal A goes high, turning on the first NMOS transistor 34. The output terminal 12 is now grounded through the first and second NMOS transistors 34 and 36 to the first auxiliary terminal 33, so the output clock signal G promptly falls to the low state. The rise of the input clock signal A also toggles the first flip-flop 14; after a certain delay, the first signal B goes low and its inverse C goes high.

At time $t_4$ the input clock signal A goes low, turning off the first NMOS transistor 34 and causing the second flip-flop 18 to latch its input C. After a certain delay the second signal D goes low, turning off the second NMOS transistor 36. The circuit is now in the same state as at time $t_0$. The above operation is repeated thereafter.

Regarding the phase difference between the first and second signals B and D, the transitions of interest are now the low-to-high transition of the second signal D and the high-to-low transition of the first signal B. In FIG. 5 the low-to-high transition of the second signal D leads the high-to-low transition of the first signal B by substantially one-half period of the input clock signal A. The invention is not limited to this timing relationship, however; it is only necessary for the low-to-high transition of the second signal D to occur before time $t_3$.

Next a fourth novel frequency divider will be described. The description will omit elements appearing in the third novel frequency divider, which will be identified by the same reference numerals.

Figure 6:
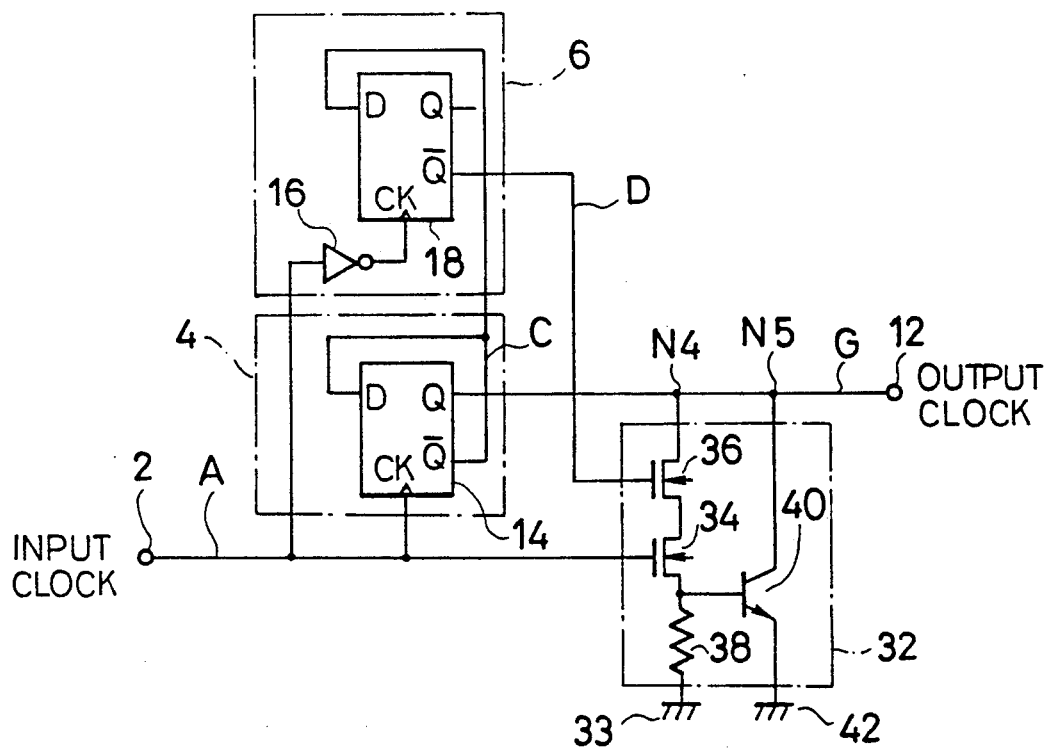
FIG. 6 is a schematic diagram of a fourth novel frequency divider.

Referring to FIG. 6, the fourth novel frequency divider is related to the third novel frequency divider in the same way that the second novel frequency divider is related to the first novel frequency divider. Specifically, the gating circuit 32 comprises a resistor 38 and a bipolar transistor 40 in addition to the first and second NMOS transistors 34 and 36. The resistor 38 is connected in series between the source of the first NMOS transistor 34 and the auxiliary terminal 33. The bipolar transistor 40 is connected in series between a fifth node N5 disposed between the fourth node N4 and the output terminal 12, and a second auxiliary terminal 42. The second auxiliary terminal 42 supplies the same potential as the first auxiliary terminal 33, in this case the ground potential. The base of the bipolar transistor 42 is connected to the source of the first NMOS transistor 34.

During the interval from $t_3$ to $t_4$ in FIG. 5 when the first and second NMOS transistors 34 and 36 are both on, the bipolar transistor 40 also turns on, connecting the output terminal 12 to ground at the second auxiliary terminal 42. The large current capacity of the bipolar transistor 40 enables the output clock signal G to fall faster than in the third novel frequency divider. This shortening of the fall time of the output clock signal is particularly noticeable when a large capacitive load is connected to the output terminal 12.

The third and fourth novel frequency dividers can be adapted for other deskewing functions. With suitable modifications they can synchronize either the rising or falling edge of the output clock signal to either the rising or falling edge of the input clock signal, as explained next.

The rising edge of the output clock signal can be synchronized to the rising edge of the input clock signal by taking the second signal D from the noninverting output Q of the second flip-flop 18 instead of from the inverting output Q, and having the auxiliary terminals 33 and 42 supply a high potential such as a power-supply potential Vcc instead of the ground potential. The first and second NMOS transistors 34 and 36 will then both be on during the interval from $t_1$ to $t_2$ in FIG. 5, advancing the rising edge of the output clock signal G.

The rising edge of the output clock signal can be synchronized to the falling edge of the input clock signal by using falling-edge-triggered flip-flops for the first and second flip-flops 14 and 18, using PMOS transistors instead of the NMOS transistors 34 and 36, and having the auxiliary terminals 33 and 42 supply Vcc.

The falling edge of the output clock signal can be synchronized to the falling edge of the input clock signal by using falling-edge-triggered flip-flops for the first and second flip-flops 14 and 18, using PMOS transistors instead of the NMOS transistors 34 and 36, and taking the second signal D from the noninverting output Q of the second flip-flop 18.

The consideration on the driving power of the transistors 22 and 24 and that of the output stage of the flip-flop 14 as discussed with reference to FIG. 1A is applicable to all other embodiments of FIG. 3, FIG. 4 and FIG. 6. That is, the driving power of the transistors 22 and 24, or of the transistors 34 and 36 must also be larger than the driving power of the output stage of the flip-flop 14.

Many other modifications can be made in the circuits shown in the drawings without departing from the spirit and scope of the invention, which should be determined solely from the appended claims. A few of the possible modifications will be mentioned next.

In place of the inverter 16 it is possible to use a two-input NOR gate having one input connected to ground, or a two-input NAND gate having one input connected to Vcc.

In the first and second novel frequency dividers, the gating circuit 10 can employ NMOS transistors instead of the first and second PMOS transistors 22 and 24, provided the second signal D is taken from the noninverting output Q of the second flip-flop 18. In this case the delay line 8 should invert as well as delay the output clock signal, by using an odd number of inverters 20 for example.

In FIG. 3 or FIG. 6, field-effect transistors can be used in place of the resistor 28 or the resistor 38.

What is claimed is:

1. A frequency divider, comprising:
   an input terminal for receiving an input clock signal that alternates between a first potential and a second potential at a certain frequency;
   first frequency dividing means coupled to receive said input clock signal from said input terminal, for dividing said frequency by an integer N greater than one to produce a first signal;
   an output terminal coupled to receive said first signal from said first frequency dividing means, for outputting an output clock signal;
   second frequency dividing means coupled to receive said input clock signal from said input terminal, for dividing said frequency by said integer N to produce a second signal differing in phase from said first signal;
   delay means coupled to receive said output clock signal from said output terminal, for delaying said output clock signal to produce a third signal; and
   gating means coupled to receive said input clock signal from said input terminal, for gating said input clock signal responsive to said second signal and said third signal and providing said input clock signal to said output terminal during intervals including transistions of said first signal from said first potential to said second potential.

2. The frequency divider of claim 1 wherein said first potential is a ground potential.

3. The frequency divider of claim 1 wherein transitions of said second signal lead transitions of said first signal by substantially one-half period of said input clock signal.

4. The frequency divider of claim 1, wherein said gating means comprises:
   a first field-effect transistor coupled to said input terminal and switched on and off by said second signal; and
   a second field-effect transistor coupled in series between said first field-effect transistor and said output terminal, and switched on and off by said third signal.

5. The frequency divider of claim 4, also having an auxiliary terminal for supplying said second potential, wherein said gating means also comprises:
   resistor means coupled in series between said second field-effect transistor and said output terminal; and
   a bipolar transistor coupled in series between said auxiliary terminal and said output terminal, and switched on and off by output of said second field-effect transistor.

6. The frequency divider of claim 1, wherein said gating means has a driving power greater than said first frequency dividing means.

7. A frequency divider, comprising:
   an input terminal for receiving a clock signal that alternates between a first potential and a second potential at a certain frequency;
   a first auxiliary terminal for supplying said first potential;
   first frequency dividing means coupled to receive said clock signal from said input terminal, for dividing said frequency by an integer N greater than one to produce a first signal;
   an output terminal coupled to receive said first signal from said first frequency dividing means, for outputting an output clock signal;
   second frequency dividing means coupled to receive said input clock signal from said input terminal, for dividing said frequency by said integer N to produce a second signal differing in phase from said first signal; and
   gating means coupled to said output terminal, for connecting said output terminal to said first auxiliary terminal during intervals including transitions of said first signal from said second potential to said first potential, responsive to said input clock signal and said second signal.

8. The frequency divider of claim 7 wherein said first potential is a ground potential.

9. The frequency divider of claim 7 wherein said first potential is a power supply potential.

10. The frequency divider of claim 7 wherein transitions of said second signal lead transitions of said first signal by substantially one-half period of said input clock signal.

11. The frequency divider of claim 7, wherein said gating means comprises:
   a first field-effect transistor coupled to said output terminal and switched on and off by said second signal; and
   a second field-effect transistor coupled in series between said first field-effect transistor and said first auxiliary terminal, and switched on and off by said clock signal.

12. The frequency divider of claim 11, also having a second auxiliary terminal for supplying said first potential, wherein said gating means also comprises:

resistor means coupled in series between said second field-effect transistor and said first auxiliary terminal; and a bipolar transistor coupled in series between said second auxiliary terminal and said output terminal, and switched on and off by output of said second field-effect transistor.

13. The frequency divider of claim 7, wherein said gating means has a driving power greater than said first frequency dividing means.

* * * * *